United States Patent
Cummings et al.

(10) Patent No.: US 8,633,478 B2
(45) Date of Patent: Jan. 21, 2014

(54) USE OF IONOMERIC SILICONE THERMOPLASTIC ELASTOMERS IN ELECTRONIC DEVICES

(75) Inventors: Michelle Cummings, Midland, MI (US); John Bernard Horstman, Midland, MI (US); Ann Walstrom Norris, Midland, MI (US); Steven Swier, Midland, MI (US)

(73) Assignee: Dow Corning Corporation, Midland, MI (US)

( * ) Notice: Subject to any disclaimer, the term of this patent is extended or adjusted under 35 U.S.C. 154(b) by 182 days.

(21) Appl. No.: 13/318,787

(22) PCT Filed: Jun. 2, 2010

(86) PCT No.: PCT/US2010/036986
§ 371 (c)(1),
(2), (4) Date: Feb. 1, 2012

(87) PCT Pub. No.: WO2010/147759
PCT Pub. Date: Dec. 23, 2010

(65) Prior Publication Data
US 2012/0125436 A1    May 24, 2012

Related U.S. Application Data

(60) Provisional application No. 61/218,560, filed on Jun. 19, 2009.

(51) Int. Cl.
*H01L 35/24* (2006.01)

(52) U.S. Cl.
USPC ........... 257/40; 257/99; 257/E51.001; 438/99

(58) Field of Classification Search
USPC ................... 257/40, 99, E51.001; 438/99
See application file for complete search history.

(56) References Cited

U.S. PATENT DOCUMENTS

| | | | |
|---|---|---|---|
| 2,676,182 A | 4/1954 | Herbert et al. |
| 2,814,601 A | 11/1957 | Currie et al. |
| 2,857,356 A | 10/1958 | Goodwin et al. |
| 5,596,061 A | 1/1997 | Berger et al. |
| 6,783,692 B2 | 8/2004 | Bhagwagar |
| 7,022,800 B2 | 4/2006 | Tachikawa et al. |
| 7,378,482 B2 | 5/2008 | Asch et al. |
| 7,429,636 B2 | 9/2008 | Asch et al. |
| 7,759,434 B2 | 7/2010 | Funk et al. |
| 2009/0151773 A1 | 6/2009 | Hayes et al. |
| 2009/0214870 A1 | 8/2009 | Morita et al. |

OTHER PUBLICATIONS

Blagodatskikh, "Polydimethylsiloxane-Based Telechelic Ionomers: Synthesis and Properties in Solution", Polymer Science, Nov. 1, 1996, pgs. vol. 38, 1239-1243.
Gornowicz, "Synthesis and Properties of Carboxylate Siloxane Ionomers", Dow Corning Corporation, Jan. 1, 1988, pp. 1009-1013.
Fukui, et. al., JP1992-0149862 abstract only.

*Primary Examiner* — Anthony Ho
(74) *Attorney, Agent, or Firm* — Catherine U. Brown

(57) ABSTRACT

This invention relates to the use of a thermoplastic elastomer comprising at least one silicone ionomer in the formation of electronic devices.

20 Claims, No Drawings ions of the ionic groups from the bulk of the polymer results in the formation of a second phase, termed ionomeric aggregates. A combination of the difference in solubility parameter between the ionic and siloxane phase and the strong ionic and coordinate bonding formed accounts for the formation of these aggregates.

According to the Eisenberg-Hird-Moore (EHM) model, the ionomeric aggregates occupy a region of about 6 Å and affect a region of about 30 Å resulting in a state of reduced polymer mobility. The small size of these ionomeric aggregates (less then the wavelength of light) ensures the transparency of these materials. The aggregation of ionic groups, also termed "multiplets", can impart physical crosslinks to the base polymer, greatly modifying the viscoelastic properties of the resulting polymer. In addition, since the crosslinks are physical crosslinks they may be broken up by heating or dissolution and therefore the materials they form may be recycled and/or reformed.

Generally, silicone polymers can form either thermoset or thermoplastic elastomers. With a thermoset elastomer, the silicone polymers are chemically crosslinked. These types of crosslinks are not reversible and therefore thermoset elastomers are not recyclable. Thermoplastic elastomers are polymeric materials which possess both plastic and rubbery properties. Thermoplastic elastomers can be processed using conventional polymer processing methods like extrusion, blow molding, melt spinning, etc. which are challenging for thermosetting systems. They have elastomeric mechanical properties but, unlike conventional thermoset rubbers, they can also be re-processed at elevated temperatures. This re-processability is a major advantage of thermoplastic elastomers over chemically crosslinked rubbers since it allows recycling of fabricated parts and results in a considerable reduction of scrap. With the increased focus on the environment it is very important to develop materials that can be recycled and/or reprocessed when no longer needed.

Electronic devices such as photovoltaic cells are generally encapsulated in an encapsulant or barrier coating material. The encapsulant is used to generally protect the cells from the environment (e.g. wind, rain, snow, dust and the like) and in accordance with general current practise is used to both encapsulate the cells and laminate them to the substrate to form an integral electronic device.

Similarly, thermal interface materials are often used on electronic devices such as semiconductors, transistors, integrated circuits (ICs), and discrete devices to conduct heat between them and the heat sink associated therewith. These thermal interface material thermally conduct the heat from the electronic device to the heat sink by surface contact.

USE OF IONOMERIC SILICONE THERMOPLASTIC ELASTOMERS IN ELECTRONIC DEVICES

CROSS-REFERENCE TO RELATED APPLICATIONS

This application is a U.S. national stage filing under 35 U.S.C. §371 of PCT Application No. PCT/US 10/036,986 filed on Jun. 2, 2010, currently pending, which claims the benefit of U.S. Provisional Patent Application No. 61/218,560 filed Jun. 19, 2009, under 35 U.S.C. §119 (e). PCT Application No. PCT/US 10/036,986 and U.S. Provisional Patent Application No. 61/218,560 are hereby incorporated by reference.

BACKGROUND OF THE INVENTION

This invention relates to the use of thermoplastic elastomers comprising at least one silicone ionomer in electronic devices. Ionomers as defined herein are polymers in which the bulk properties are governed by ionic interactions in discrete regions of the material (i.e., ionic aggregates). These predominantly nonpolar macromolecules contain ionic groups as part of the chain, usually at levels less than 15 mol %. Broad literature exists on organic ionomers. Phase segregation of the ionic groups from the bulk of the polymer results in the formation of a second phase, termed ionomeric aggregates.

BRIEF SUMMARY OF THE INVENTION

The present invention is a method of encapsulating a photovoltaic device with a thermoplastic elastomer. The method comprises sandwiching at least one layer of a thermoplastic elastomer between a superstrate and a photovoltaic cell. The thermoplastic elastomer of the present invention comprises a silicone ionomer having the average formula (1) $(X_vR_{3-v}SiO_{1/2})_a(X_wR_{2-w}SiO_{2/2})_b(X_yR_{1-y}SiO_{3/2})_c(SiO_{4/2})_d$ where each R is an independently selected monovalent alkyl group or aryl group, each X is independently selected from a monovalent alkyl group, aryl group and a carboxy functional group having a Formula (2) -G-COOZ, where G is a divalent spacer group having at least 2 spacing atoms, each Z is independently selected from hydrogen or a cation independently selected from alkali metal cations, alkali earth metal cations, transition metal cations, and metal cations, v is 0 to 3, w is 0 to 2, y is 0 to 1, $0 \le a \le 0.9$; $0 \le b \le 1$; $0 \le c \le 0.9$, $0 \le d \le 0.3$ and $a+b+c+d=1$, provided that on average there is at least 0.002 mole carboxy functional groups per silicon atom and at least 10 mole percent of the Z groups of the carboxy functional group are an independently selected cation.

The present invention also comprises a photovoltaic device comprising a superstrate; a thermoplastic elastomer disposed on a surface of the superstrate; and a photovoltaic cell disposed on the thermoplastic elastomer. The thermoplastic elastomer comprises at least one silicone ionomer having an average Formula (1) $(X_vR_{3-v}SiO_{1/2})_a(X_wR_{2-w}SiO_{2/2})_b(X_yR_{1-y}SiO_{3/2})_c(SiO_{4/2})_d$ where each R is an independently selected monovalent alkyl group or aryl group, each X is independently selected from a monovalent alkyl group, aryl group and a carboxy functional group having a Formula (2) -G-COOZ, where G is a divalent spacer group having at least 2 spacing atoms, each Z is independently selected from hydrogen or a cation independently selected from alkali metal cations, alkali earth metal cations, transition metal cations, and metal cations, v is 0 to 3, w is 0 to 2, y is 0 to 1, $0 \le a \le 0.9$; $0 \le b \le 1$; $0 \le c \le 0.9$, $0 \le d \le 0.3$ and $a+b+c+d=1$, provided that on average there is at least 0.002 mole carboxy functional groups per silicon atom and at least 10 mole percent of the Z groups of the carboxy functional group are an independently selected cation.

The present invention also comprises a method of dissipating heat. The method comprises interposing a silicone ionomer along a thermal path between a heat source and a heat spreader. The silicone ionomer has an average Formula (1) $(X_vR_{3-v}SiO_{1/2})_a(X_wR_{2-w}SiO_{2/2})_b(X_yR_{1-y}SiO_{3/2})_c(SiO_{4/2})_d$ where each R is an independently selected monovalent alkyl group or aryl group, each X is independently selected from a monovalent alkyl group, aryl group and a carboxy functional group having a Formula (2) -G-COOZ, where G is a divalent spacer group having at least 2 spacing atoms, each Z is independently selected from hydrogen or a cation independently selected from alkali metal cations, alkali earth metal cations, transition metal cations, and metal cations, v is 0 to 3, w is 0 to 2, y is 0 to 1, $0 \le a \le 0.9$; $0 \le b \le 1$; $0 \le c \le 0.9$, $0 \le d \le 0.3$ and a+b+c+d=1, provided that on average there is at least 0.002 mole carboxy functional groups per silicon atom and at least 10 mole percent of the Z groups of the carboxy functional group are an independently selected cation.

DETAILED DESCRIPTION OF THE INVENTION

All amounts, ratios, and percentages are by weight unless otherwise indicated. The following is a list of definitions, as used herein.

Definitions and Usage of Terms

"A" and "an" each mean one or more.

"Alkyl" means a monovalent saturated hydrocarbon group.

"Combination" means two or more items put together by any method.

"Copolymer" means a polymer made from at least two distinct monomers. Copolymer includes, but is not limited to, polymers made from only two distinct monomers.

"Encapsulated" means that at least one surface of the object to be encapsulated has encapsulant on it.

"Photovoltaic cell" means a device that converts light directly into electricity by the photovoltaic effect "Siloxane" and "silicone" are used synonymously herein.

"Silicone resin" means a polymer having a branched molecular structure comprising $R_xSiO_{(4-x)/2}$ units where each R is an organic group; each x is 0, 1, 2, or 3; with the proviso that at least one unit has x greater than 1.

"Substituted" means one or more hydrogen atoms bonded to a carbon atom has been replaced with another substituent.

In the present invention, the silicone ionomer which is useful for making a thermoplastic elastomer has an average Formula (1)

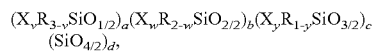
$(SiO_{4/2})_d$, where each R is an independently selected monovalent alkyl group or aryl group, each X is independently selected from a monovalent alkyl group, aryl group and a carboxy functional group having a Formula (2) -G-COOZ, where G is a divalent spacer group having at least 2 spacing atoms, each Z is independently selected from hydrogen or a cation independently selected from alkali metal cations, alkali earth metal cations, transition metal cations, and metal cations, v is 0 to 3, w is 0 to 2, y is 0 to 1, $0 \le a \le 0.9$; $0 \le b \le 1$; $0 \le c \le 0.9$, $0 \le d \le 0.3$ and a+b+c+d=1, provided that on average there is from 0.002 to 0.5 moles carboxy functional groups per silicon atom and at least 10 mole percent of the Z groups of the carboxy functional group are an independently selected cation.

Each R is an independently selected monovalent alkyl group or aryl group. Alternatively, each R is an independently selected alkyl group having 1 to 10 carbon atoms or an aryl group having 6 to 20 carbon atoms. Alternatively, each R is an independently selected methyl or phenyl group. Alternatively, each R is methyl. Examples of useful alkyl groups include methyl, ethyl, n-propyl, iso-propyl, n-butyl, isobutyl, tert-butyl, n-pentyl, iso-pentyl, neopentyl and tert-pentyl; hexyl, such as the n-hexyl group; heptyl, such as the n-heptyl group; octyl, such as the n-octyl and isooctyl groups and the 2,2,4-trimethylpentyl group; nonyl, such as the n-nonyl group; decyl, such as the n-decyl group; cycloalkyl radicals, such as cyclopentyl, cyclohexyl and cycloheptyl radicals and methylcyclohexyl radicals Examples of aryl groups include phenyl, naphthyl; o-, m- and p-tolyl, xylyl, ethylphenyl, and benzyl.

In Formula (1), subscript v is 0 to 3, w is 0 to 2, and y is 0 to 1. Further, $0 \le a \le 0.9$, alternatively $0 \le a \le 0.7$, alternatively $0 \le a \le 0.5$; $0 \le b \le 1$; alternatively $0.5 \le b \le 1$, alternatively $0.7 \le b \le 1$; $0 \le c \le 0.9$, alternatively $0 \le c \le 0.5$, alternatively $0 \le c \le 0.3$; $0 \le d \le 0.3$; alternatively $0 \le d \le 0.2$, alternatively $0 \le d \le 0.1$, and a+b+c+d=1. A person skilled in the art would know that the siloxane units in Formula 1 such as $(X_vR_{3-v}SiO_{1/2})$ are often referred to as a M unit, $(X_wR_{2-w}SiO_{2/2})$ are often referred to as a D unit, $(X_yR_{1-y}SiO_{3/2})$ are often referred to as a T unit, and $(SiO_{4/2})_d$ are often referred to as a Q unit.

Each X group of Formula (2) is independently selected from a monovalent alkyl group, aryl group and a carboxy functional group having the Formula (2) -G-COOZ. With respect to Formula (2), each G is a divalent spacing group having at least 2 spacing atoms, alternatively G is a divalent hydrocarbon group having at least 2 carbon atoms or a divalent hydrocarbonoxy group having at least 2 carbon atoms. Alternatively, G is an alkylene group having 2 to 20 carbon atoms. The divalent hydrocarbon group can be illustrated by alkylene groups selected from $-(CHR^2)_s-$ where s has a value of 2 to 20 and $R^2$ is hydrogen or a group defined by R above, such as $-CH_2CH_2-$, $-CH_2CH(CH_3)-$, $-CH_2CH(CH_3)CH_2-$, $-CH_2CH_2CH(CH_2CH_3)CH_2CH_2CH_2-$. The divalent hydrocarbon group can also be illustrated by arylene groups selected from $-(CH_2)_uC_6H_4-$, $-CH_2CH(CH_3)(CH_2)_uC_6H_4-$, and $-(CH_2)_tC_6H_4(CH_2)_u-$ where t has a value of 1 to 20 and u has a value of 0 to 10. The divalent hydrocarbonoxy group can be illustrated by $-OCH(R)(CH_2)_t-$ and $-OCH(CH_3)(CH_2)_t-$ where R and t is as described above.

With respect to Formula (2), each Z is hydrogen or a cation independently selected from alkali metals, alkali earth metals, transition metals and metals. Alternatively, each cation is independently selected from Li, Na, K, Cs, Mg, Ca, Ba, Zn, Cu, Ni, Ga, Al, Mn, and Cr. Alternatively, each cation is independently selected from Li, Na, K, Zn, Ni, Al, Mn, Mg. Alternatively, each cation is independently selected from Li, Na, K, Zn, Al, Mg. One skilled in the art would understand that a cation derived from a certain metal can have different valences depending on the number of associated ligands. For example, $Mn^{2+}$ and $Mn^{3+}$ neutralized carboxylic acid functional siloxane ionomers can be prepared depending on the manganese neutralization agent used.

Generally, on average there are from 0.002 to 0.5 mole carboxy functional groups per silicon atom. Alternatively, on average there are from 0.01 to 0.4 mole carboxy functional groups per silicon atom. Alternatively, on average there are 0.02 to 0.2 mole carboxy functional groups per silicon atom.

Further, at least 10 mole percent of the Z groups of the carboxy functional group are an independently selected cation. Alternatively, at least 25 mole percent of the Z groups of the carboxy functional group are an independently selected cation. Alternatively, at least 50 mole percent of the Z groups of the carboxy functional group are an independently selected cation. Alternatively, at least 75 mole percent of the Z groups of the carboxy functional group are an independently selected cation. Alternatively, 100 mole percent of the Z groups of the carboxy functional group are an independently selected cation. The carboxy functional group may be present in any of the M, D or T siloxane units described by subscripts a, b, and c. Alternatively, the carboxy functional group may be present in the M and D siloxane units described by subscripts a and b.

The degree of polymerization (dp) of the silicone ionomer can vary depending on the desired properties. Alternatively, the dp of the silicone ionomers can be from 10 to 10,000; alternatively 20 to 5,000; alternatively 40 to 5,000.

If desired, several different ionomers can be blended into the thermoplastic elastomer. For example, several different ionomers with different cations can be blended to change the properties or characteristics of the thermoplastic elastomer.

For example, one can change the flow, the processing properties, the performance in the desired application and the like.

If desired, the thermoplastic elastomer can include a cure package to cure the thermoplastic elastomer once set. The following cure packages can be used.

(Cure 1)

Cure 1 comprises a standard hydrosilylsation cure as is known in the art. The components of this cure comprise a polyorganosiloxane having two or more alkenyl groups, a hydrosilylation catalyst and a cross-linking agent in the form of a polyorganosiloxane having at least two silicon-bonded hydrogen atoms per molecule. A hydrosilylation or addition cure reaction is the reaction between an Si—H group (typically provided as a cross-linker) and an Si-alkenyl group, typically a vinyl group, to form an alkylene group between adjacent silicon atoms (≡Si—CH$_2$—CH$_2$—Si≡). The Preferably the catalyst of Cure 1 is a hydrosilylation (i.e. addition cure type) catalyst may comprise any suitable platinum, rhodium, iridium, palladium or ruthenium based catalyst. However preferably the catalyst in Cure 1 is a platinum based catalyst. The platinum-based catalyst may be any suitable platinum catalyst such as for example a fine platinum powder, platinum black, chloroplatinic acid, an alcoholic solution of chloroplatinic acid, an olefin complex of chloroplatinic acid, a complex of chloroplatinic acid and alkenylsiloxane, or a thermoplastic resin that contain the aforementioned platinum catalyst. The platinum catalyst is used in an amount such that the content of metallic platinum atoms constitutes from 0.1 to 500 parts by weight per 1,000,000 parts by weight of polydiorganosiloxane having alkenyl groups.

The cross-linking agent of Cure 1 may be in the form of a polyorganosiloxane having at least two silicon-bonded hydrogen atoms per molecule and has the following average unit formula:

$$R^i{}_b SiO_{(4-b)/2}$$

where each $R^i$ may be the same or different and is hydrogen, an alkyl group such as methyl, ethyl, propyl, and isopropyl or an aryl group such as phenyl and tolyl. The cross-linking agent may have a linear, partially branched linear, cyclic, or a net-like structure.

Examples of the aforementioned organopolysiloxane include one or more of the following:—
a trimethylsiloxy-terminated polymethylhydrogensiloxane,
a trimethylsiloxy-terminated copolymer of methylhydrogensiloxane and dimethylsiloxane,
a dimethylhydrogensiloxy-terminated copolymer of methylhydrogensiloxane and
dimethylsiloxane,
a cyclic polymer of methylhydrogensiloxane,
a cyclic copolymer of methylhydrogensiloxane and dimethylsiloxane,
an organopolysiloxane composed of siloxane units expressed by the formula $(CH_3)_3SiO_{1/2}$, siloxane units expressed by the formula $(CH_3)_2HSiO_{1/2}$, and siloxane units expressed by the formula $SiO_{4/2}$,
an organopolysiloxane composed of siloxane units expressed by the formula $(CH_3)_2HSiO_{1/2}$, siloxane units expressed by the formula $CH_3SiO_{3/2}$,
an organopolysiloxane composed of siloxane units expressed by the formula $(CH_3)_2HSiO_{1/2}$, siloxane units expressed by the formula $(CH_3)_2SiO_{2/2}$, and siloxane units expressed by the formula $CH_3SiO_{3/2}$,
a dimethylhydrogensiloxy-terminated polydimethylsiloxane,
a dimethylhydrogensiloxy-terminated copolymer of methylphenylsiloxane and dimethylsiloxane, and
a dimethylhydrogensiloxy-terminated copolymer of a methyl (3,3,3-trifluoropropyl) siloxane and dimethylsiloxane; or by using cyclic silicone hydride cross linkers as outlined in WO2003/093349 or WO2003/093369 (incorporated herein by reference).

It is recommended that cross-linking agent be added in an amount such that the mole ratio of silicon-bonded hydrogen atoms in the cross-linking agent to the mole number of alkenyl groups in the polydiorganosiloxane having alkenyl groups is in the range of from 0.1:1 to 5:1, more preferably it is in the range of from 0.8:1 to 4:1. If the above ratio is lower than 0.1:1, the density of cross-linking will be too low and it will be difficult to obtain a rubber-like elastomer. A ratio having an excess of Si—H groups (i.e. >1:1) is preferred to enhance adhesion between the superstrate/substrate e.g. glass and the encapsulant.

If Cure 1 is used, the composition may also comprise one or more curing inhibitors in order to improve handling conditions and storage properties of the composition, for example acetylene-type compounds, such as 2-methyl-3-butyn-2-ol, 2-phenyl-3-butyn-2-ol, 3,5-dimethyl-1-hexyn-3-ol, 1-ethynyl-1-cyclohexanol, 1,5-hexadiene, 1,6-heptadiene; 3,5-dimethyl-1-hexen-1-yne; 3-ethyl-3-buten-1-yne and/or 3-phenyl-3-buten-1-yne; an alkenylsiloxane oligomer such as 1,3-divinyltetramethyldisiloxane, 1,3,5,7-tetravinyltetramethyl cyclotetrasiloxane, or 1,3-divinyl-1,3-diphenyldimethyldisiloxane; a silicon compound containing an ethynyl group such as methyltris (3-methyl-1-butyn-3-oxy) silane; a nitrogen-containing compound such as tributylamine, tetramethylethylenediamine, benzotriazole; a similar phosphorus-containing compound such as triphenylphosphine; as well as sulphur-containing compounds, hydroperoxy compounds, or maleic-acid derivatives.

The aforementioned curing inhibitors are used in an amount of from 0 to 3 parts by weight, normally from 0.001 to 3 parts by weight, and preferably from 0.01 to 1 part by weight per 100 parts by weight of component polyorganosiloxane having alkenyl groups. Most preferable among the curing inhibitors are the aforementioned diallylmaleate-type compounds.

(Cure 2)

Cure 2 comprises a peroxide cure of siloxanes as is known in the art. It consists of peroxide catalysts which are used for free-radical based reactions between siloxanes comprising:—
≡Si—CH$_3$ groups and other ≡Si—CH$_3$ groups; or
≡Si—CH$_3$ groups and ≡Si-alkenyl groups (typically vinyl); or
≡Si-alkenyl groups and ≡Si-alkenyl groups. Suitable peroxide catalysts may include but are not restricted to 2, 4-dichlorobenzoyl peroxide, benzoyl peroxide, dicumyl peroxide, tert-butyl perbenzoate. 1,1-bis(t-butylperoxy)-3, 3,5-trimethylcyclohexane (TMCH) (2,5-bis(t-butylperoxy)-2,5-dimethylhexane) catalyst 1,1-bis(tert-amylperoxy)cyclohexane, Ethyl 3,3-bis(tert-amylperoxy)butyrate and 1,1-bis(tert-butylperoxy)cyclohexane, delivered as a neat compound or in an inert matrix (liquid or solid).

The peroxide is preferably present in an amount of from 0.01 to 500 parts by weight per 1,000,000 parts by weight of siloxane.

When Cure 2 is used, one or more radical initiators is/are utilised the temperature at which the curing is initiated is generally determined/controlled on the basis of the half-life of the radical initiators, however the rate of cure and ultimate physical properties are controlled by the level of unsaturation.

There are a large number of silicone species which can be used to achieve a critical level of unsaturation necessary for a given reaction profile. The reaction kinetics and physical properties can be tuned by blending, linear non-reactively endblocked polymers with differing degrees of polymerization(dp) with dimethylmethylvinyl-copolymers with or without vinyl endblocking.

Cure 3

Cure 3 is a condensation cure of siloxanes as is known in the art. This cure is used with siloxanes that contain hydroxy and/or hydrolysable groups, a condensation catalyst and or more silanes or siloxane based cross-linkers which contain silicon bonded hydrolysable groups such as acyloxy groups (for example, acetoxy, octanoyloxy, and benzoyloxy groups); ketoximino groups (for example dimethyl ketoximo, and isobutylketoximino); alkoxy groups (for example methoxy, ethoxy, an propoxy) and alkenyloxy groups (for example isopropenyloxy and 1-ethyl-2-methylvinyloxy);

Any suitable condensation catalyst may be utilised to cure the composition. These include condensation catalysts including tin, lead, antimony, iron, cadmium, barium, manganese, zinc, chromium, cobalt, nickel, aluminium, gallium or germanium and zirconium. Examples include organic tin metal catalysts such as alkyltin ester compounds such as Dibutyltin dioctoate, Dibutyltin diacetate, Dibutyltin dimaleate, Dibutyltin dilaurate, butyltin 2-ethylhexoate. 2-ethylhexoates of iron, cobalt, manganese, lead and zinc may alternatively be used but titanate and/or zirconate based catalysts are preferred. Such titanates and zirconates may comprise a compound according to the general formula $Ti[OR]_4$ and $Zr[OR]_4$ respectively, where each R may be the same or different and represents a monovalent, primary, secondary or tertiary aliphatic hydrocarbon group which may be linear or branched containing from 1 to 10 carbon atoms. Optionally the titanate may contain partially unsaturated groups. However, preferred examples of R include but are not restricted to methyl, ethyl, propyl, isopropyl, butyl, tertiary butyl and a branched secondary alkyl group such as 2,4-dimethyl-3-pentyl. Preferably, when each R is the same, R is an isopropyl, branched secondary alkyl group or a tertiary alkyl group, in particular, tertiary butyl.

Alternatively, the titanate may be chelated. The chelation may be with any suitable chelating agent such as an alkyl acetylacetonate such as methyl or ethylacetylacetonate. Examples of suitable titanium and/or zirconium based catalysts are described in EP1254192 which is incorporated herein by reference. The amount of catalyst used depends on the cure system being used but typically is from 0.01 to 3% by weight of the total composition The catalyst chosen for inclusion depends upon the speed of cure required. When the cross-linker of Cure 3 are oximosilanes or acetoxysilanes a tin catalyst is generally used for curing, especially diorganotin dicarboxylate compounds such as dibutyltin dilaurate, dibutyltin diacetate, dimethyltin bisneodecanoate. For compositions which include alkoxysilane cross linker compounds, the preferred curing catalysts are titanate or zirconate compounds such as tetrabutyl titanate, tetraisopropyl titanate, or chelated titanates or zirconates such as for example diisopropyl bis(acetylacetonyl)titanate, diisopropyl bis(ethylacetoacetonyl)titanate, diisopropoxytitanium Bis(Ethylacetoacetate) and the like.

The cross linker used in Cure 3 is preferably a silane compound containing hydrolysable groups. These include one or more silanes or siloxanes which contain silicon bonded hydrolysable groups such as acyloxy groups (for example, acetoxy, octanoyloxy, and benzoyloxy groups); ketoximino groups (for example dimethyl ketoximo, and isobutylketoximino); alkoxy groups (for example methoxy, ethoxy, and propoxy) and alkenyloxy groups (for example isopropenyloxy and 1-ethyl-2-methylvinyloxy).

In the case of siloxanes the molecular structure can be straight chained, branched, or cyclic. The cross linker may have two but preferably has three or more silicon-bonded hydrolysable groups per molecule. When the cross linker is a silane and when the silane has three silicon-bonded hydrolysable groups per molecule, the fourth group is suitably a non-hydrolysable silicon-bonded organic group. These silicon-bonded organic groups are suitably hydrocarbyl groups which are optionally substituted by halogen such as fluorine and chlorine. Examples of such fourth groups include alkyl groups (for example methyl, ethyl, propyl, and butyl); cycloalkyl groups (for example cyclopentyl and cyclohexyl); alkenyl groups (for example vinyl and allyl); aryl groups (for example phenyl, and tolyl); aralkyl groups (for example 2-phenylethyl) and groups obtained by replacing all or part of the hydrogen in the preceding organic groups with halogen. Preferably however, the fourth silicon-bonded organic groups is methyl.

Silanes and siloxanes which can be used as cross linkers in condensation cure systems include alkyltrialkoxysilanes such as methyltrimethoxysilane (MTM) and methyltriethoxysilane, alkenyltrialkoxy silanes such as vinyltrimethoxysilane and vinyltriethoxysilane, isobutyltrimethoxysilane (iBTM). Other suitable silanes include ethyltrimethoxysilane, vinyltriethoxysilane, phenyltrimethoxysilane, alkenyl alkyl dialkoxysilanes such as vinyl methyl dimethoxysilane, vinyl ethyldimethoxysilane, vinyl methyldiethoxysilane, vinylethyldiethoxysilane, alkenylalkyldioximosilanes such as vinyl methyl dioximosilane, vinyl ethyldioximosilane, vinyl methyldioximosilane, vinylethyldioximosilane, alkoxytrioximosilane, alkenyltrioximosilane, alkenylalkyldiacetoxysilanes such as vinyl methyl diacetoxysilane, vinyl ethyldiacetoxysilane, vinyl methyldiacetoxysilane, vinylethyldiacetoxysilane and alkenylalkyldihydroxysilanes such as vinyl methyl dihydroxysilane, vinyl ethyldihydroxysilane, vinyl methyldihydroxysilane, vinylethyldihydroxysilane, methylphenyl-dimethoxysilane, 3,3,3-trifluoropropyltrimethoxysilane, methyltriacetoxysilane, vinyltriacetoxysilane, ethyl triacetoxysilane, di-butoxy diacetoxysilane, phenyl-tripropionoxysilane, methyltris(methylethylketoximo) silane, vinyl-tris-methylethylketoximo)silane, methyltris (methylethylketoximino)silane, methyltris(isopropenoxy) silane, vinyltris(isopropenoxy)silane, ethylpolysilicate, n-propylorthosilicate, ethylorthosilicate, dimethyltetraacetoxydisiloxane. Further alternative cross-linkers include Alkylalkenylbis(N-alkylacetamido) silanes such as methylvinyldi-(N-methylacetamido)silane, and methylvinyldi-(N-ethylacetamido)silane; dialkylbis(N-arylacetamido) silanes such as dimethyldi-(N-methylacetamido)silane; and dimethyldi-(N-ethylacetamido)silane; Alkylalkenylbis(N-arylacetamido) silanes such as methylvinyldi(N-phenylacetamido)silane and dialkylbis(N-arylacetamido) silanes such as dimethyldi-(N-phenylacetamido)silane. The cross-linker used may also comprise any combination of two or more of the above.

Cure 4

Cure 4 contains a cationic initiator which can be used when siloxanes containing cycloaliphatic epoxy functionality are present. These cationic initiators are suitable for thermal and/or UV cure. The preferred resins may be prepared, such that when compounded with iodonium or sulfonium salts will yield a cured network on heating. The initiation temperature of such systems can be controlled by the use of suitable radical initiators. These systems can also be cured by UV-visible irradiation when sensitized with suitable UV-visible radical initiators such those described above as the peroxide. The functionality and catalyst levels can be tuned to initiate cure at high speeds under ambient conditions then effect bonding and final cure in the laminator.

In addition to the silicone ionomer, it may also be useful, depending on the desired application for the thermoplastic elastomer, to add at least one MQ resin. MQ resins are macromolecular polymers comprised primarily of $R^1{}_3 SiO_{1/2}$ and $SiO_{4/2}$ units (the M and Q units, respectively) where $R^1$ is a functional or nonfunctional, substituted or unsubstituted monovalent radical. Alternatively, $R^1$ is methyl or phenyl. Those skilled in the art will appreciate that such resins may also include a limited number of $R^1{}_2 SiO_{2/2}$ and $R^1 SiO_{3/2}$ units, respectively referred to as D and T units. As used herein, the term "MQ resin" means that, on average, no more than about 20 mole percent of the resin molecules are comprised of D and T units. Generally, when an MQ resin is added up to 80 weight parts based on 100 weight parts of the silicone ionomer may be used. Alternatively, from 10 to 70 weight parts based on 100 weight parts of the silicone ionomer may be used. Alternatively, from 30 to 65 weight parts on the same basis may be used.

MQ resins are commercially available or made by known processes. For example, U.S. Pat. No. 2,814,601 to Currie et al., Nov. 26, 1957, which is hereby incorporated by reference, discloses that MQ resins can be prepared by converting a water-soluble silicate into a silicic acid monomer or silicic acid oligomer using an acid. When adequate polymerization has been achieved, the resin is end-capped with trimethylchlorosilane to yield the MQ resin. Another method for preparing MQ resins is disclosed in U.S. Pat. No. 2,857,356 to Goodwin, Oct. 21, 1958, which is hereby incorporated by reference. Goodwin discloses a method for the preparation of an MQ resin by the cohydrolysis of a mixture of an alkyl silicate and a hydrolyzable trialkylsilane organopolysiloxane with water. MQ resins have also reportedly been prepared by cohydrolysis of the corresponding silanes or by silica hydrosol capping methods known in the art. MQ resins used may also be prepared by the silica hydrosol capping processes of Daudt, et al., U.S. Pat. No. 2,676,182;

Another optional ingredient is a filler. The filler may be added in an amount up to 99 weight parts based on 100 weight parts of the silicone ionomer. Alternatively, from 0 to 50 weight parts based on 100 weight parts of the silicone ionomer may be used. Alternatively, from 5 to 30 weight parts on the same basis may be used. Fillers useful in the instant invention may be exemplified by, but not limited to, inorganic materials such as pyrogenic silica, precipitated silica and diatomaceous silica, ground quartz, aluminum silicates, mixed aluminum and magnesium silicates, zirconium silicate, mica powder, calcium carbonate, glass powder and fibers, titanium oxides of the pyrogenic oxide and rutile type, barium zirconate, barium sulphate, barium metaborate, boron nitride, lithopone, the oxides of iron, zinc, chrome, zirconium, and magnesium, the different forms of alumina (hydrated or anhydrous), graphite, lamp black, asbestos, metal particles and calcined clay and organic materials such as the phthalocyaniines, cork powder, sawdust, synthetic fibers and synthetic polymers (polytetrafluoroethylene, polyethylene, polypropylene, polystyrene and polyvinyl chloride). The filler may be of a single type or mixtures of several types.

Typically, the amount of filler will be higher in a composition that is used in dissipating heat. For example, up to 96 wt % of the thermoplastic elastomer could be filler for heat dissipation uses. Alternatively, between 40 and 96 wt. % of the thermoplastic elastomer could be filler. Additionally, when used for heat dissipation, the filler is typically metal particles, metal oxide particles, or a combination thereof.

In general, small amounts of additional ingredients may also be added to the compositions of this invention. For example, antioxidants, pigments, stabilizers, moisture scavengers, diluents, carriers, filler treatments and others, may be added as long as they do not materially alter the requirements stipulated herein.

The silicone ionomers useful to make the thermoplastic elastomers of the invention can be made by hydrosilylating a siloxane polymer bearing hydrogen groups (SiH functionality) with protected undecylenic acid (e.g. trimethylsilylated undecylenic acid) in solution. A platinum catalyst may be used to aid the reaction. After stripping the polymer from solvent, the siloxane polymer bearing protected undecylenic acid groups is converted into the carboxylic acid functional derivatized material by deprotection with methanol. To obtain the corresponding ionomeric silicones, the carboxylic acid functional siloxane is neutralized with metal salts, usually metal acetylacetonates, being mindful of the valency of the specific metal counter-ion of interest. For example, for a divalent counter-ion, a molar ratio of 1 to 2 metal salt to carboxylic acid should be used to attain 100% neutralization. After formation of the ionomeric siloxane, the solvent is stripped under vacuum to obtain a solid material with thermoplastic elastomeric properties. Optional ingredients can be added before the stripping step or afterwards by using an appropriate co-solvent. Alternatively, extrusion at temperatures above the flow temperature of the ionomeric siloxane can be used to introduce optional ingredients without the use of solvent.

The thermoplastic elastomers containing silicone ionomers of the present invention can be used in any form from a liquid to a solid. For example, the thermoplastic elastomer can be formed into a liquid and the liquid poured to encapsulate the photovoltaic cell or applied between the electronic device and the heat spreader. Typically, however, the thermoplastic elastomer is used in the form of a sheet.

Typically, the sheets of thermoplastic elastomer are prepared by using a suitable extruder. The thermoplastic elastomer can be introduced onto the extruder in the form of a solution in a suitable solvent (e.g., an aromatic solvent) and the solvent is then stripped out subsequent to mixing. Alternatively, the thermoplastic elastomer can be liquefied, for example, by heating and then introducing it into the extruder. Any ingredients other than the silicone ionomer (e.g. diluents, adhesion promoters, filler, resins, etc.) can be mixed with the ionomer composition prior to introducing it into the extruder or they can all be introduced into the extruder by any suitable method at an appropriate point in the extruder. Mixing may take place at any suitable temperature up to about 500 C. For example, temperatures in the range of 80 to 150 C may be used. Any suitable extruder and mixing device can be used.

After the thermoplastic elastomer is extruded, it can be pressed into sheets and/or rolls (e.g. using a platen press) to form a film having the desired thickness.

Alternatively, sheet material may be prepared using a single or twin screw extruder. The screw speed and barrel temperature are such to maintain a temperature below the boiling point or reaction temperature of all the ingredients, preferably less than 200° C. A vacuum de-airing section may be utilized to ensure void free films. The extruder feeds a sheeting die via a manifold at high pressure to maintain a uniform sheet profile with good production speed. The sheet is cooled on a cold roll to solidify the thermoplastic elastomer and an optional release liner can be fed into the take up roll providing for a continuous roll of sheet.

Alternatively, the ionomer composition sheets of the present invention may be prepared by simply casting the sheets from solvent onto a desired substrate such as, for example, the photovoltaic cell superstrate, onto the electronic device or heat spreader, or onto a continuous release liner.

Alternatively, the ionomer composition sheets of the present invention may be prepared by spraying the ionomer onto a desired substrate with or without a solvent. The substrate can be, for example, the photovoltaic cell superstrate, the electronic device or heat spreader, or a continuous release liner.

Often, the films resulting from the above process are up to 0.1 mm thick, alternatively up to 0.5 mm thick, alternatively up to 1 mm thick and alternatively up to 5 mm thick depending on the application. Such films may be protected using suitable release liners prior to use.

Suitable release liners consist of wax coated paper, polypropylene film, fluoropolymer films with our without release coatings. While a release liner is not essential preferably one or both sides of the sheet produced continuously in this manner is protected with a release liner. The resulting sheets may be prepared on a continuous roll or cut and stacked to specific width and length requirements as determined by their end use.

The resulting sheet(s) may be further processed to impart for example a dimpled surface as is common among EVA suppliers. The provision of dimpling on the sheets is intended to reduce problems caused by surface tack and aids in air removal during encapsulation.

In one aspect of the present invention, there is provided a process for encapsulating a photovoltaic cell, the process comprise the steps of laminating the following "sandwich" of layers.

1) superstrate,
2) flexible silicone sheet in accordance with the present invention,
3) photovoltaic cell and, if sheet (2) dies not encapsulate the photovoltaic cell,
4) an encapsulant applied to the opposite side of the photovoltaic module as sheet (2) and, optionally,
5) a substrate in the form of a suitable backing material on top of encapsulant (4)

In another aspect of the present invention, there is provided a process for encapsulating a photovoltaic cell, the process comprise the steps of laminating the following "sandwich" of layers.

a) A superstrate,
b) A thin film photovoltaic applied on the substrate;
c) A flexible silicone sheet in accordance with the present invention applied on the thin film photovoltaic for encapsulation,
d) a substrate in the form of a suitable backing material on top of encapsulant (c)

Typically a series of photovoltaic cell modules are interconnected to form a solar array which functions as a single electricity producing unit wherein the cells and modules are interconnected in such a way as to generate a suitable voltage in order to power a piece of equipment or supply a battery for storage etc. These interconnected modules, too, can be encapsulated according to the present invention.

The photovoltaic cells can be made of any material and by any method. Often, the cells are polycrystalline or monocrystalline silicon Likewise, they can be made from wafers or a thin film of a photovoltaic such as silicon deposited on a substrate.

Usually wafer based photovoltaic cell modules are designed using a superstrate (e.g., glass), usually in combination with a substrate and having one or more layers of the encapsulant of the invention as a cell adhesive for adhering the cells to the superstrate and when present to the substrate. Hence, light passes through the transparent superstrate and encapsulant/adhesive before reaching the semiconducting wafer.

Usually Si-deposited photovoltaic cell modules are designed using a superstrate (e.g., glass) onto which the Si is deposited and then coated with one or more layers of the encapsulant of the invention.

The substrate, when present, is in the form of a rigid or stiff backskin which is designed to provide protection to the rear surface of the module. A wide variety of materials have been proposed for the substrate, which does not necessarily need to be transparent to light. These include the same materials as the superstrate e.g. glass but may also include materials such as organic fluoropolymers such as ethylene tetrafluoroethylene (ETFE), Tedlar®, or poly ethylene terephthalate (PET) alone or coated with silicon and oxygen based materials ($SiO_x$).

It is a useful feature of the present invention that the thermoplastic elastomer sheet exhibits hot melt characteristics in that at room temperature it is in the form of a flexible sheet, whereas when heated (e.g., placed in a laminator application of heat) will result in the "melting" of the sheet so as to act as an adhesive between the superstrate and the photovoltaic cell(s). In one embodiment in accordance with the method of the present invention encapsulation is undertaken via a lamination process.

Preferably (4) above is also a thermoplastic elastomer in accordance with the present invention, either applied as a sheet or by some other means such as spraying or dispensing. (4) may be of the same composition as sheet (2). However, as discussed above, sheet (2) has to be transparent to light but sheet (4) need not be. Therefore, it can be strengthened by incorporation of fillers. Moreover, sheet (4) could be made of any known encapsulant such as silicone gel, silicone elastomer or EVA. However, while (4) may be different it is typically of a similar nature to sheet (2) to promote adhesion between the two layers during lamination so as to result in good inter-lamination between sheet (2) and (4). When (4) is filled, the additional strength provided by filler can render the substrate (5) redundant.

The thermoplastic elastomers of the invention can be used to encapsulate the photovoltaic cells in any desirable manner. Typically, the thermoplastic elastomer is disposed on the superstrate. Typically, this is accomplished by placing a sheet of the thermoplastic elastomer on the superstrate. Once this is accomplished, the photovoltaic cell is then disposed on the thermoplastic elastomer. Finally, the superstrate, thermoplastic elastomer and photovoltaic cell is heated above the flow temperature of the thermoplastic elastomer so as to flow the material on the superstrate and the cell.

If a thin film photovoltaic is used, the thin film (e.g., silicon) is applied on the substrate. A sheet of thermoplastic elastomer of the invention is applied on the thin film photovoltaic for encapsulation. As above, a substrate in the form of a suitable backing material may optionally be applied on top of the thermoplastic elastomer.

Optionally, a second layer of a encapsulant can be disposed on the photovoltaic cell prior to heating. As discussed above, the second layer of encapsulant can be the same or different than the first layer and can comprise, for example, a silicone ionomer, a silicone gel, a silicone elastomer or EVA.

Optionally, a substrate can be disposed on the second layer of a encapsulant prior to heating. Compositions of the substrates are described above.

Typically, the above processes are completed in a vacuum laminator as is know in the art but other known means such as spraying may be used.

The thermoplastic elastomer is generally used to protect the photovoltaic device from the environment (e.g. wind, rain, snow, dust and the like). In accordance with general current practise for photovoltaic devices, the thermoplastic elastomer is used to both encapsulate the cells and laminate them to the substrate and/or superstrate to form an integral photovoltaic cell module.

The thermoplastic elastomer can also be used as a thermal interface material. Such a materials are used to coat the surfaces of the electronic devices and the heat spreader. Since such surfaces are typically not completely smooth, it is difficult to achieve full contact between the surfaces. Air spaces, which are poor thermal conductors, appear between the surfaces and increase impedance. These spaces can be filled by inserting a thermal interface material between the surfaces.

The thermoplastic elastomers of the present invention are useful for this purpose in that they melt and flow to achieve a complete coverage of the surface. Typically, they are disposed along a thermal path between a electrical device heat source an the heat spreader, although they can be applied on any surface for which heat dissipation is desired. The thermoplastic elastomer can be interposed by any convenient means, such as applying a sheet between the heat source and the heat spreader with or without an adhesive or primer, hot-melt dispensing the thermoplastic elastomer, or solvent casting the thermoplastic elastomer.

The heat source can comprise any electronic device such as a semiconductor, a transistor, an integrated circuit, or a discrete device.

The heat spreader can comprise a heat sink, a thermally conductive plate, a thermally conductive cover, a fan, a circulating coolant system, a combination thereof, or others. The thermoplastic elastomer can be used in direct contact with the electronic device and the heat spreader. The thermoplastic elastomer can be applied either to the electronic device and thereafter the heat spreader, or the thermoplastic elastomer can be applied to the heat spreader and thereafter to the electronic device. Alternatively, the heat spreader and/or the electronic device can be totally coated with the thermoplastic elastomer.

During or after disposing the thermoplastic elastomer along the thermal path, the thermoplastic elastomer can be heated to a temperature equal to or greater than the flow temperature. Pressure may be applied. The thermoplastic elastomer composition can then be cooled.

In each of the above processes, the thermoplastic elastomer is generally heated above its flow temperature, which will be specific to the molecular weight, ion content, type of counterion and extent of neutralization of the silicone ionomer. The strength of the physical cross-links introduced through the ionic aggregates can be modified by changing the metal counter-ion type. For example changing the metal counter-ion from $Na^+$ to $Mg^{++}$ will increase the flow temperature. In addition, increasing the metal ion neutralization extent increases the strength of the physical crosslinks and therefore also increases the flow temperature. In this way, flow temperatures can be adjusted.

Precursor linear polydimethylsiloxanes (PDMS) are typically flowable liquids at temperatures as low as $-80°$ C. Conversion to a metal neutralized silicone ionomer can increase the flow temperature dramatically, for example for the linear polydimethylsiloxanes from $-80°$ C. to $300°$ C. Depending on the molecular weight, ion content, type of counter-ion and extent of neutralization, the flow temperature of a silicone ionomer can be at least $0°$ C. Alternatively, the flow temperature of a silicone ionomer can range from $0°$ C. to $300°$ C., alternatively from $100°$ C. to $300°$ C., alternatively from $100°$ C. to $250°$ C.

The storage moduli of thermoplastic elastomer at room temperature are from $10^2$ Pa to $10^8$ Pa, alternatively from $10^3$ Pa to $10^8$ Pa, alternatively from $10^4$ to $10^7$ Pa. As a reference, a typical high molecular weight polydimethylsiloxane (termed 'gum') will have a storage modulus in the $10^3$ to $10^4$ Pa range, considerably lower than what can be achieved with silicone ionomers. A glassy material, for example a polydimethylsiloxane at temperature below its glass transition (below $-125°$ C.) has a storage modulus of $10^9$ Pa.

Unlike other PSAs or hot melts, after the desired components are bonded with the thermoplastic elastomer of the invention, the present invention only requires that the temperature cool down for it to harden, there is no curing time. Rather, upon cooling, the ionic aggregate re-form to an elastomer. With other PSAs or hot melts, the time required for completion of the cure process ranges from about a day to more than a month, depending for example, upon the catalyst type, catalyst level, temperature and humidity.

EXAMPLES

The following examples are included to demonstrate preferred embodiments of the invention. It should be appreciated by those of skill in the art that the techniques disclosed in the examples which follow represent techniques discovered by the inventor to function well in the practice of the invention, and thus can be considered to constitute preferred modes for its practice. However, those of skill in the art should, in light of the present disclosure, appreciate that many changes can be made in the specific embodiments which are disclosed and still obtain a like or similar result without departing from the spirit and scope of the invention. All parts and percentages in the examples are on a weight basis and all measurements were obtained at $25°$ C., unless indicated to the contrary.

Test Methods:

$^{29}$Si Nuclear Magnetic Resonance Spectroscopy (NMR)

Ionomer samples for NMR analysis were prepared by introducing approximately 4 grams of sample into a vial and diluting with approximately 4 grams of 0.04M Cr(acac)3 solution in CDCl3. Samples were mixed and transferred into a silicon-free NMR tube. Spectra were acquired using a Varian Mercury 400 MHz NMR.

Rheology Measurements (Storage Modulus, Loss Modulus, Viscosity Measurements):

A TA Instruments ARES-RDA (2KSTD standard flexular pivot spring transducer) with forced convection oven was used to measure the storage modulus (G') and loss modulus (G") of siloxane ionomers. Test specimens (typically 8 mm wide, 0.1 mm thick) were loaded in between parallel plates and measured using small strain oscillatory rheology while ramping the temperature in a range from $-120°$ C. to $250°$ C. at $2°$ C./min (frequency 1Hz). Viscosity of flowable liquids were measured using the same instrument in steady shear mode at different temperatures, typically using a 25 mm cone and plate fixture.

Gel Permeation Chromatography (GPC):

The sample was prepared in Toluene at 0.5% concentration, filtered and analyzed against PDMS standards using refractive index detection. The columns were two 300 mm Mixed C with a 50 mm guard column. The flow rate was 1 mL/min.

DSC Experiments

A TA Instruments Q2000 differential scanning calorimeter (DSC) with a liquid nitrogen cooling system (LNCS) was used to measure the glass transition ($T_g$). A sample of about 10 mg was introduced in a TA Instruments hermetic pan. Indium was used as a calibration standard for heat flow and temperature. Samples were heated at 10° C./min using helium as a purge gas (25 mL/min).

Tensile Properties

Stress-strain properties of ionomer siloxanes were obtained by testing dog bone shaped samples in an INSTRON at a 5 mm/min drawing speed. Samples were tested up to failure.

Example 1

Synthesis of Polydimethylsiloxanes (PDMS) Bearing 3.3 mol % Pendant Carboxy Acid Functional Radicals Reactants:
PDMS bearing pendant hydrogen groups (SiH) amounting to 3.3 mol % SiH, more specifically with composition: $(Me_3SiO_{1/2})_{0.017}(MeHSiO_{2/2})_{0.033}(Me_2SiO_{2/2})_{0.95}$ where Me is a methyl radical; degree of polymerization (d.p.) 200, steady shear viscosity at 25° C.: $\eta_{25}=0.35$ Pa·s; prepared by methods known in the art such as described in EP 0196169B1

Toluene (Fisher Scientific)

trimethylsilylated undecylenic acid, prepared as described, for example, in EP0196169B1

Pt on alumina (heterogeneous catalyst, Sigma Aldrich)

methanol (Sigma Aldrich)

319.4 g of a PDMS having pendant hydrogen groups (SiH functionality) amounting to 3.3 mol % SiH was loaded to the reaction vessel together with 319.4 g toluene to make a 50% solids solution. A nitrogen blanket was applied, the mixture was heated to 100° C. and 55 g of trimethylsilylated undecylenic acid was added. This amounted to a 50 mol % excess of the protected acid (1.5 mol protected acid for 1 mol SiH). 1.17 g of a 1 wt % Pt on alumina powder was added, corresponding to 20 ppm of Pt based on the sum of SiH functional PDMS, toluene and trimethylsilylated undecylenic acid. The mixture was heated and kept at 100° C. for 2.5 hours. Additional trimethylsilylated undecylenic acid (22.3 g) was introduced in two steps and the reaction temperature increased to 110° C. for 6 hours. Infrared analysis indicated complete conversion of the SiH functionality on PDMS. The reaction mixture was filtered through a 0.45 μm filter. A colorless, clear material was obtained. The polymer was stripped from solvent and residual unreacted trimethylsilylated undecylenic acid using a 0.4 mm Hg vacuum at 140° C. To deprotect polymer and convert it to the carboxy acid functional version, 336 g of the polymer was added to 224 g of toluene (60 wt % solids solution). 50 g of methanol was added to deprotect the acid under reflux for two hours.

NMR analysis confirmed the expected final structure of the product based on the SiH PDMS precursor: $(Me_3SiO_{2/2})_{0.032}(MeR'SiO_{2/2})_{0.95}$ where Me is a methyl radical and R' corresponds to the carboxy acid functional radical -G-COOH with G corresponding to $-(CH_2)_{10}-$ (based on undecylenic acid).

The material was a clear, color-free, solvent-free low viscosity liquid. Molecular weight and viscosity data on this polymer: $M_w=28,000$ g/mol; $M_n=8,810$ g/mol; $\eta_{25}=0.35$ Pa·s Example 2

Synthesis of Polydimethylsiloxanes Bearing Pendant Carboxy Acid Functional Radicals, Neutralized with Different Levels of Lithium Counter-Ions The carboxy acid functional PDMS, prepared in example 1, was neutralized with Lithium counter-ions (Li⁺) to three different extents: 50%, 75% and 100%. In the case of 50%, for example, half of the carboxy acid functional radicals are converted with the Li⁺ counter-ion to give $-(CH_2)_{10}-COO^-Li^+$ and half are not converted and remain $-(CH_2)_{10}-COOH$. Each polymer was neutralized by loading 30 g of the carboxy acid functional PDMS with the desired amount of lithium acetylacetonate (Sigma Aldrich) to reach the stated levels of neutralization and 10 g of methanol and 20 g of toluene. After mixing for 1 hour at 70° C., the temperature was increased to 150° C. and vacuum was applied at 15 mbar for 2 hours to ensure the by-product of neutralization, acetylacetone, was removed while driving the neutralization to completion. The following materials were obtained.

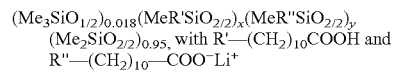

$(Me_3SiO_{1/2})_{0.018}(MeR'SiO_{2/2})_x(MeR''SiO_{2/2})_y$
$(Me_2SiO_{2/2})_{0.95}$, with R'—$(CH_2)_{10}$COOH and
R''—$(CH_2)_{10}$—COO⁻Li⁺

TABLE 1

Characteristics of Li⁺ neutralized carboxy acid functional PDMS: $(Me_3SiO_{1/2})_{0.018}(MeR'SiO_{2/2})_x(MeR''SiO_{2/2})_y(Me_2SiO_{2/2})_{0.95}$ with R'—$(CH_2)_{10}$COOH and R''—$(CH_2)_{10}$COO⁻Li⁺

| Targeted neutralization | Composition (NMR) | Observation at 25° C. | Viscosity at 25° C. |
|---|---|---|---|
| 0% | x = 0.032, y = 0 | clear, low viscosity liquid | 0.300 Pa·s |
| 50% | x = 0.016, y = 0.016 | clear, high viscosity liquid | 14.6 Pa·s |
| 75% | x = 0.008, y = 0.024 | clear, very high viscosity liquid | 22,000 Pa·s |
| 100% | x = 0, y = 0.032 | clear, elastic solid gel | 1.10⁶ Pa·s* |

*value estimated from an oscillatory rheology measurement using small strains

Example 3

Viscoelastic Behavior of Polydimethylsiloxanes Bearing Pendant Carboxy Acid Functional Radicals, Neutralized with Different Levels of Lithium Counter-Ions: Illustration of Thermoplastic Elastomeric Behavior and Control Over the Melt Flow Temperature and Rubbery Plateau Modulus Insight into the drastic viscoelastic property changes that take place when an acid-functional PDMS is neutralized to different extents with Li⁺ can be obtained from small strain shear oscillatory rheology experiments. Both the storage modulus (G') and loss modulus (G'') are shown as a function of temperature are tested. The storage modulus relates to the rigidity or stiffness of the material, while the loss modulus is proportional to the amount of energy dissipated through heat. The acid-functional PDMS neutralized 100% with Li⁺ counter-ions, for example following its rheological profile from low to high temperature, is in the glassy state below the glass transition of the PDMS matrix (around −125° C.), passes through the glass/rubber transition to a rubbery material extending from −100° C. to room temperature, and enters the melt-flow regime into a viscous liquid beyond this temperature range. This profile indicates one of the key aspects of the current invention related to thermoplastic elastomers. The metal neutralized PDMS ionomers behave like elastomeric rubbers at temperature around room temperature, where energy can be stored and small time-scale deformations to the material are reversible. Once heated to higher temperatures, the thermal break-up of the ionomeric interactions reverts the material back to a viscous liquid. In this high temperature range, the material behaves like a high molecular weight PDMS polymer.

Reducing the level of neutralization is a convenient method to alter the flow temperature and the temperature range of the rubbery plateau modulus. Note that the G' value in the rubbery plateau regime or the rubbery plateau modulus is indicative for the cross-link density, which in case of these ionomeric siloxanes corresponds to the physical cross-links that form through ionomeric aggregates. This value will relate to application-related properties like hardness, tack and elasticity.

Example 4

Synthesis of Polydimethylsiloxanes Bearing Pendant Carboxy Acid Functional Radicals, 50% Neutralized with Different Metal Counter-Ions: Impact on Flow Temperature and Rubbery Plateau Modulus The carboxy acid functional PDMS, prepared in example 1, was neutralized with a range of metal counter-ions: metals like $Al^{3+}$ (Aluminum trivalent, using Aluminum acetylacetonate, Sigma Aldrich), transition metals like $Zn^{++}$ (Zinc divalent, using Zinc acetylacetonate, Sigma Aldrich), $Mn^{++}$ (Manganese divalent, using Manganese (II) acetylacetonate, Sigma Aldrich), $Zr^{4+}$ (Zirconium tetravalent, using Zirconium acetylacetonate, Sigma Aldrich), $Mn^{3+}$ (Manganese trivalent, using Manganese (III) acetylacetonate, Sigma Aldrich), $Cr^{3+}$ (Chromium trivalent, using Chromium acetylacetonate, Sigma Aldrich) and alkali metals like $Li^+$ (Lithium monovalent, using Lithium acetylacetonate, Sigma Aldrich, see Example). 50% conversion of the carboxy functional radical was targeted based on the valency of the counter-ion under investigation. For example, 50% neutralization with $Cr^{3+}$ corresponded to mixing 0.5/3 mol of the Chromium salt with 1 mol of the —$(CH_2)_{10}$—COOH functionality on PDMS. The procedure was the same for all metal counter-ions and consisted of loading 30 g of the carboxy acid functional PDMS with the desired amount of the metal acetylacetonate to reach the stated levels of neutralization and 10 g of methanol and 20 g of toluene. After mixing for 1 hour at 70° C., the temperature was increased to 150° C. and vacuum was applied at 15 mbar for 2 hours. This makes sure the by-product of neutralization, acetylacetone, is removed while driving the neutralization to completion. Materials were synthesized so that half of carboxy functional radicals remained with the other half neutralized with the appropriate metal counter-ion. Materials properties are given in Table 2.

TABLE 2

Characteristics of 50% neutralized carboxy acid functional PDMS based on $(Me_3SiO_{1/2})_{0.018}(MeR'SiO_{2/2})_{0.032}(Me_2SiO_{2/2})_{0.95}$ with R'—$(CH_2)_{10}$—COOH

| Counter-ion | Observation at 25° C. | Rubbery plateau modulus*, Pa |
|---|---|---|
| $Li^+$ | clear, high viscosity liquid | 45,400 |
| $Cr^{3+}$ | clear soft crumbly solid, green color | 6,919 |

TABLE 2-continued

Characteristics of 50% neutralized carboxy acid functional PDMS based on $(Me_3SiO_{1/2})_{0.018}(MeR'SiO_{2/2})_{0.032}(Me_2SiO_{2/2})_{0.95}$ with R'—$(CH_2)_{10}$—COOH

| Counter-ion | Observation at 25° C. | Rubbery plateau modulus*, Pa |
|---|---|---|
| $Al^{3+}$ | clear, soft crumbly solid | 46,854 |
| $Mn^{2+}$ | clear, high viscosity liquid, brown color | 143,000 |
| $Mn^{3+}$ | clear, high viscosity liquid, dark brown color | 41,081 |
| $Zn^{2+}$ | clear, high viscosity liquid | 72,278 |
| $Zr^{4+}$ | clear, rubbery solid | 14,405 |
| $Mg^{2+}$ | clear, rubbery solid | 278,000 |

*the rubbery plateau modulus determined as G' at the minimum in tan δ (G"/G') in a tan δ vs. temperature oscillatory shear rheology experiment As indicated in Table 2, a range of rubbery plateau moduli can be obtained by changing the metal counter-ion. Generally, a higher rubbery plateau modulus results in harder, less tacky materials.

Example 5

Synthesis of a Low Molecular Weight Polydimethylsiloxanes Bearing Telechelic Carboxy Acid Functional Radicals and its $Li^+$ Neutralized Version To make the endcap or telechelic versions of ionomeric PDMS, the starting precursor needs to be an SiH terminated PDMS and the procedure outlined in example 1 and 2 can be used. The procedure used to make a 10 mol % telechelic carboxy acid functional PDMS consists of using the following reactants:

PDMS bearing telechelic hydrogen groups (SiH) amounting to 10 mol % SiH, more specifically DOW CORNING® Q2-5057S (Dow Corning, Midland, Mich.)
toluene (Fisher Scientific)
trimethylsilylated undecylenic acid, prepared as described, for example, in EP0196169B1
Pt on alumina (heterogeneous catalyst, Sigma Aldrich)
methanol (Sigma Aldrich)

150 g of a PDMS having telechelic hydrogen groups (SiH functionality) amounting to 10 mol % SiH was loaded to the reaction vessel together with 150 g toluene to make a 50% solids solution. A nitrogen blanket was applied, the mixture was heated to 90° C. and 60.53 g of trimethylsilylated undecylenic acid was added. This amounted to a 4 mol % excess of the protected acid (1.04 mol protected acid for 1 mol SiH). 0.72 g of a 1 wt % Pt on alumina powder was added, corresponding to 20 ppm of Pt based on the sum of SiH functional PDMS, toluene and trimethylsilylated undecylenic acid. The mixture was heated and kept at 100° C. for 1 hour. Infrared analysis indicated no residual SiH after this step. The reaction mixture was filtered through a 0.22 μm filter. A colorless, clear material was obtained. The polymer was stripped from solvent and residual unreacted trimethylsilylated undecylenic acid using a 0.4 mm Hg vacuum at 140° C. To deprotect the polymer and convert it to the carboxy acid functional version, 150 g of the polymer was added to 100 g of toluene (60 wt % solids solution). 100 g of methanol was added to deprotect the acid under reflux for two hours. The final material was stripped from solvent on a rotary evaporator at 150° C. and 0.8 mmHg for 1 hour.

NMR analysis confirmed the expected final structure of the product based on the SiH PDMS precursor: $(Me_2R'SiO_{1/2})_{0.103}(Me2SiO_{2/2})_{0.897}$ where Me is a methyl radical and R' corresponds to the carboxy acid functional radical $—(CH_2)_{10}—COOH$. The material was a clear, color-free, solvent-free low viscosity liquid.

The $Li^+$ 100% neutralized version of the 10.3 mol % carboxy acid functional PDMS material was obtained by loading 50 g of the PDMS precursor into 35 g toluene, 15 g methanol and adding 5.907 g Lithium acetylacetonate stoichiometrically. The reaction mixture was heated to 80° C. for 1 h. The polymer solution was stripped from solvent on a rotary evaporator at 155° C. and 0.8 mmHg for 2.5 h. The final material was a colorless, hard solid at room temperature.

Example 6

Synthesis of High Molecular Weight Polydimethylsiloxanes ($M_w$=100,000 g/mol) Bearing 1 mol % Telechelic Carboxy Acid Functional Radicals, 100% Neutralized with $Mg^{++}$ Counter-Ions or 100% Neutralized with $Li^+$ Counter-Ions The telechelic version of ionomeric PDMS with high molecular weight and consequently low carboxy acid functionality started from the SiH terminated precursor and follows a procedure similar to example 5. The procedure used to make a 1 mol % telechelic carboxy acid functional PDMS used the following reactants:

PDMS bearing telechelic hydrogen groups (SiH) amounting to 1.3 mol % SiH, more specifically with composition: $(Me_2HSiO_{1/2})_{0.013}(Me2SiO_{2/2})_{0.987}$ where Me is a methyl radical; degree of polymerization (d.p.) is about 1,000 (see example 1 for specifics on SiH precursors);
toluene (Fisher Scientific)
trimethylsilylated undecylenic acid, prepared as described, for example, in EP0196169B1
Pt on alumina (heterogeneous catalyst, Sigma Aldrich)
methanol (Sigma Aldrich)

175 g of a PDMS having telechelic hydrogen groups (SiH functionality) amounting to 1.3 mol % SiH was loaded to the reaction vessel together with 61 g toluene to make a 74% solids solution. A nitrogen blanket was applied, the mixture was heated to 100° C. and 8.27 g of trimethylsilylated undecylenic acid was added. This amounts to a 5 mol % excess of the protected acid (1.05 mol protected acid for 1 mol SiH). 0.49 g of a 1 wt % Pt on alumina powder was added, corresponding to 20 ppm of Pt based on the sum of SiH functional PDMS, toluene and trimethylsilylated undecylenic acid. The mixture was heated and kept at 100° C. for 1 hour. Infrared analysis indicated very little residual SiH after this step. The reaction mixture was filtered through a 0.22 µm filter. A colorless, clear material was obtained. To deprotect the polymer and convert it to the carboxy acid functional version, 40 g of methanol was added. The mixture was heated at reflux for 2 hours. The final material was stripped from solvent on a rotary evaporator at 150° C. and 0.8 mmHg for 1 hour.

NMR analysis confirmed the expected final structure of the product based on the SiH PDMS precursor: $(Me_2R'SiO_{1/2})_{0.013}(Me_2SiO_{2/2})_{0.987}$ where Me is a methyl radical and R' corresponds to the carboxy acid functional radical $—(CH_2)_{10}—COOH$. The material was a clear, color-free, solvent-free low viscosity liquid.

The $Li^+$ 100% neutralized version of the 1.3 mol % carboxy acid functional PDMS material was obtained by loading 50 g of the PDMS precursor into 35 g toluene, 15 g methanol and adding 0.833 g Lithium acetylacetonate stoichiometrically. The reaction mixture was heated at 80° C. for 1 hour. The polymer solution was stripped from solvent on a rotary evaporator at 170° C. and 0.6 mmHg for 2 hours. The final material was a colorless, extremely high viscosity liquid at room temperature.

The $Mg^{++}$ 100% neutralized version of the 1.3 mol % carboxy acid functional PDMS was made similarly by adding magnesium acetylacetonate (Sigma Aldrich) stoichiometrically to the carboxy acid precursor.

A comparison between the low molecular weight/high ion containing $Li^+$ neutralized ionomer from Example 5 and the high molecular weight/low ion containing $Li^+$ neutralized ionomer from Example 6 is given in Table 3. It is clear from this analysis that the ion content dominates the rheology behavior, since the highest rubbery plateau modulus and flow temperature is found for the 10 mol % ionomer, which has the lowest molecular weight. From a rheological perspective, the highest ion containing polymer self-assembles into a much higher effective molecular weight or cross-link density than its low ion counter-part. When compared to the results in Example 4 on the effect of counter-ion type, the telechelic ionomers based on one counter-ion type but different ion contents can have some advantages if material properties at room temperature (rubbery plateau modulus) and flow temperatures need to be optimized, for example, for a hot melt application, without changing the metal counter-ion used. Basically, these two procedures to alter the properties of PDMS-based ionomers offer flexibility in materials design.

TABLE 3

Characteristics of 100% $Li^+$ neutralized telechelic carboxy acid functional PDMS: high $M_w$/low ion content (1.3 mol %, Example 6) and low $M_w$/high ion content (10 mol %, Example 5)

| Ion content $(—(CH_2)_{10}—COO^-$ $Li^+)$ | Observation at 25° C. | Rubbery plateau modulus*, Pa | Flow temperature**, ° C. |
|---|---|---|---|
| 1.3 mol % | clear, extremely high viscosity | 217,000 | 120 |
| 10 mol % | clear, hard solid | 9,380,000 | 160 |

*rubbery plateau modulus determined as G' at the minimum in tan δ (G"/G') in a tan δ vs. temperature oscillatory shear rheology experiment
**flow temperature, as determined from the temperature at which G' reaches 1 kPa upon heating Example 7

Comparison Between a High Molecular Weight Polydimethylsiloxanes ($M_w$=100,000 g/mol) Bearing 1 mol % Carboxy Acid Functional Radicals, 100% Neutralized with $Mg^{++}$ Counter-Ions and a Chemically Cross-Linked PDMS Rubber A comparison is made between an ionomeric PDMS with physical cross-links and a chemically cross-linked PDMS rubber as far as rheology and mechanical properties. To compare these systems side-by-side, a similar cross-link density is targeted for both materials. This was achieved by selecting the vinyl-functional PDMS and SiH cross-linker for the chemically cross-linked PDMS rubber appropriately. To check the level of cross-link density, either physical or chemical, the rubbery plateau modulus was used, since this value can be used to calculate the molecular weight between cross-links, $M_c$, regardless of the chemistry used:

$$M_c = \rho . R . T / G^N_0$$

with: $M_c$ the molecular weight between cross-links, ρ the density, R the gas constant, T the temperature and $G^N_0$ the rubbery plateau modulus. The following two materials were compared in this manner:

1. 100% $Mg^{++}$ neutralized 1 mol % carboxy acid functional PDMS from example 7.
2. vinyl-functional PDMS cured with an SiH cross-linker using a Pt catalyst, based on the following formulation: 170 g DOW CORNING® SFD-117 Filtered Fluid (Dow Corning, Midland Mich.) a vinyl-containing polymer (d.p. 434), 30 g DOW CORNING® 2-7220 INTERMEDIATE a SiH cross-linker (Dow Corning, Midland Mich.), and 20 ppm of a Pt catalyst DOW CORNING® 2-0707 INT (PLATINUM 4) (Dow Corning, Midland Mich.) (0.56% Pt) was used in combination with 0.5 wt % of 2-methyl-3-butyn-2-ol inhibitor (Sigma Aldrich) to cure the rubber at 50° C. over 24 hours. The polymer, cross-linker and inhibitor were mixed together at room temperature and introduced in a vacuum oven at room temperature to get the bubbles out. The Pt catalyst was added to this mixture and the sample was introduced in an air evacuated oven at 50° C. for 2 days to fully cure the elastomer.

The rubbery plateau modulus values are similar for both materials as summarized in Table 4. The effective cross-link density of both materials must therefore be similar in a temperature range below 150° C. where the ionomer starts to flow. Note that the chemically cross-linked PDMS rubber doesn't exhibit flow at any temperature below its degradation temperature.

TABLE 4

Characteristics of 1. PDMS ionomer: 100% $Mg^{++}$neutralized telechelic carboxy acid functional PDMS: high $M_w$/low ion content (1.3 mol %, Example 6) compared to 2. PDMS rubber: a chemically cross-linked PDMS rubber

| Material | Observation at 25° C. | Rubbery plateau modulus*, Pa | Flow temperature**, ° C. |
|---|---|---|---|
| PDMS ionomer | clear, elastic solid | 133,000 | 150 |
| PDMS rubber | clear, elastic solid | 190,000 | n/a*** |

*rubbery plateau modulus determined as G' at the minimum in tan δ (G"/G') in a tan δ vs. temperature oscillatory shear rheology experiment
**flow temperature, as determined from the temperature at which G' reaches 1 kPa upon heating
***chemically cross-linked elastomeric rubber does not flow at any temperature To confirm the similarity in mechanical properties between the PDMS rubber and its ionomeric counterpart, the tensile properties are compared at room temperature. Both the tensile strength (around 50 psi=350 kPa) and strain at break (around 180%) are similar.

Example 8

Blends of PDMS Ionomers with Different Ion Contents

Two PDMS ionomers were blended to illustrate the level of property control that can be achieved by modifying the physical cross-link density. Two benefits are obtained simultaneously which are difficult to achieve with a chemically cross-linked PDMS:

1) The PDMS ionomers form miscible, transparent blends over a wide composition range. This is in part due to their identical chemical constituents, even though the ion content might differ.
2) There is no issue with stoichiometric imbalance since the physical cross-link points are formed from the aggregation of one type of functionality, e.g. $COO^-Li^+$. This is in contrast to a vinyl/SiH cured PDMS, for example, where higher cross-link densities would require both the vinyl and SiH content to be increased if no stoichiometric imbalance is acceptable.

A telechelic PDMS ionomer with high ion content, detailed in example 5 (10 mol % $COO^-Li+$PDMS ionomer), was blended with a pendant PDMS ionomer with low ion content (1.9 mol % $COO^-Li^+$ ionomer) similar to the one detailed in Example 2. Although the inventors do not want to be held to one theory, it is believed, that the low ion content, high molecular weight PDMS ionomer with low ion content forms the bulk of the material and introduces some entanglement strength to the blends' properties. The low molecular weight, high ion content PDMS ionomer can be considered to be a physical cross-linker, linking sites of the high molecular weight ionomer through ionic aggregates.

The blending procedure consisted of introducing the appropriate amounts of each ionomer into a 9/1 mixture of toluene to methanol to make a 20% solids solution. A rotating mixing wheel was used for 10 hours to ensure complete dissolution. Mixtures were introduced on Teflon films and heat treated using the following step-wise profile: 1 hour at 80° C., 1 hour at 100° C., 20 min at 150° C. Samples were allowed to cool to room temperature slowly. Table 5 contains the details on the effect of blend ratio on rheological properties. All the samples were transparent solid films at room temperature. The table shows that a range of rubbery plateau moduli and flow temperatures can be accessed simply by blending two PDMS ionomers. This adds materials design flexibility since only two materials have to be synthesized while a blend can be made to reach a certain targeted behavior.

TABLE 5

Characteristics of ionomer blends based on A) a 100% $Li^+$ neutralized telechelic carboxy acid functional PDMS: low $M_w$/high ion content (10 mol %, example 5) and B) a 100% neutralized pendant carboxy acid functional PDMS: high $M_w$/low ion content (1.9 mol % , similar to Example)

| Ratio A/B | Observation at 25° C. | Rubbery plateau modulus*, Pa | Flow temperature**, ° C. |
|---|---|---|---|
| 1/0 | clear, hard solid, non-tacky | 9,380,000 | 160 |
| 3/7 | clear, rubbery solid, slight tack | 4,220,000 | 158 |
| 2/8 | clear, rubbery solid, slight tack | 2,980,000 | 154 |
| 1/9 | clear, rubbery solid, slight tack | 2,000,000 | 146 |
| 0/1 | clear, flexible, tacky solid | 1,000,000 | 137 |

*rubbery plateau modulus determined as G' at the minimum in tan δ (G"/G') in a tan δ vs. temperature oscillatory shear rheology experiment
**flow temperature, as determined from the temperature at which G' reaches 1 kPa upon heating

Example 9

Synthesis of Resin-Linear Materials

An additional level of control over material properties and compatibility can be achieved by modifying the base siloxane, either by incorporating branching or introducing phenyl modification. Branching will dramatically raise the glass transition of the siloxane polymer, which is around $-125°$ C. for PDMS-based ionomers. Phenyl modification will also raise the glass transition but, more importantly, improve compatibility with organic matrices like epoxides, polyesters, acrylates, etc. A phenyl-modified, branched siloxane ionomer with the following composition was targeted:

$(MeR'SiO_{2/2})_{0.09}(MeR''SiO_{2/2})_{0.81}(R'SiO_{3/2})_{0.10}$ with $R'$—$(CH_2)_{10}$—COOH and $R''$ a phenyl radical.

A different procedure was used in this case, even though hydrosilylation with trimethylsilylated undecylenic acid could also be employed in this case. More information on the procedure which starts from an amine-functional precursor and uses itaconic acid to convert into a carboxy-functional material, can be found in Berger A.; Fost D. L. U.S. Pat. No. 5,596,061; 1997, *Organosilicone having a carboxyl functional group thereon*. Hydrolysis and condensation of the following alkoxysilanes will result in the targeted building blocks:

phenylmethyldimethoxy silane (DOW CORNING® Z-2588 Phenylmethyldimethoxy Silane) 597.9 g (3.28 mol)
aminopropyl methyl diethoxysilane (DOW CORNING® Z-6015 Silane) 61.2 g (0.32 mol)
phenyltrimethoxysilane (DOW CORNING® Z-6124 Silane) 79.3 g (0.4 mol)
Other reactants/catalysts that were used:
xylenes (Sigma Aldrich)
de-ionized water
potassium hydroxide (1N KOH aq, Sigma Aldrich)
hydrochloric acid (1N HCl aq, Sigma Aldrich)
itaconic acid (Sigma Aldrich)

A reaction vessel was loaded with the alkoxysilanes and heated to 50° C. 9.56 mL of 1N KOH was added followed by 151.4 g of de-ionized water (amounts to twice the stoichiometric amount). The temperature was raised to 73° C. for 30 min. 536 g of xylenes were added. The volatiles were distilled off up to a reaction temperature of 85° C. The aqueous phase was removed and the reaction mixture was cooled to 50° C. 9.56 mL of 1N HCl was added to neutralize the KOH and stirring was applied for 1 h at 25° C. The mixture was heated to reflux and water was removed by azeotropic distillation. After cooling the reaction mixture to 85° C., 44.05 g itaconic acid was added, which corresponds to a 5 mol % excess to the amine (—$NH_2$) groups. The reaction mixture was heated to reflux for 3 hours and water was again removed using azeotropic distillation. The final product was stripped from solvent on a rotary evaporator at 150° C. using 0.5 mmHg vacuum for 1 h. The product was a solvent-free, clear, orange-color viscous liquid at room temperature. The composition of the final material as confirmed by NMR:$(MeR'SiO_{2/2})_{0.093}$ $(MeR''SiO_{2/2})_{0.799}(R'SiO_{3/2})$ 0.10 with $R'$—$(CH_2)_{10}$—COOH and $R''$ a phenyl radical To prepare the metal neutralized versions of the carboxy-functional branched phenyl siloxane ionomer, the polymer was dissolved in a ⅔ toluene/methanol mixture at 40 wt % polymer solids. The appropriate metal acetylacetonate was introduced at the targeted stoichiometry and the reaction mixture was heated to 85° C. for 1 hour with mixing. The metal neutralized carboxy-functional siloxane was stripped from solvent on a rotary evaporator at 160° C. and 0.6 mmHg vacuum for 1 hour.

A range of metal counter-ions were used to prepare 100% neutralized versions of the carboxy-functional branched phenyl siloxane ionomer, resulting in the properties listed in Table 6.

TABLE 6

Characteristics of metal neutralized branched phenyl siloxane ionomers based on $(MeR'SiO_{2/2})_{0.093}(MeR''SiO_{2/2})_{0.799}(R''SiO_{3/2})_{0.10}$ with $R'$—$(CH_2)_{10}$—COOH and $R''$ a phenyl radical

| Counter-ion | Observation at 25° C. | Rubbery plateau modulus*, Pa | Flow temperature**, ° C. | Glass transition***, ° C. |
|---|---|---|---|---|
| $Zn^{2+}$ | clear, tacky solid, flows over time | n.a. | 41 | 0 |
| $Na^+$ | clear, tacky solid, some elasticity | 417,000 | 55 | −2 |
| $Li^+$ | clear, tacky solid, doesn't flow | 327,000 | 81 | −3 |
| $Mg^{2+}$ | clear, slightly tacky | 5,380,000 | 142 | −2 |
| $Ca^{2+}$ | clear, tacky solid | 4,000,000 | 160 | −1 |
| $Cu^{2+}$ | clear, crumbly solid, elastic | 2,590,000 | 155 | 0 |
| $Ni^{2+}$ | clear, crumbly solid | 1,560,000 | 200 | 2 |

*rubbery plateau modulus determined as G' at the minimum in tan δ (G''/G') in a tan δ vs. temperature oscillatory shear rheology experiment
**flow temperature, as determined from the temperature at which G' reaches 1 kPa upon heating
***glass transition as measured by oscillatory shear rheology as the maximum in tan δ vs. temperature The results in Table 6 indicate the wide range of properties that are accessible starting from the same carboxy-functional precursor. These materials are prime candidates for hot melt applications that can rely both on the increased matrix glass transition (around 0° C. in Table 6) and the selection of counter-ion to meet certain melt flow specifications (melt flow temperatures from 41° C. up to 200° C. in Table 6). The tensile properties listed in Table 7 indicate that these materials also hold promise as elastomeric rubbers.

TABLE 7

Tensile properties of a $Li^+$ and $Mg^{2+}$ neutralized branched phenyl siloxane ionomer based on $(MeR'SiO_{2/2})_{0.093}(MeR''SiO_{2/2})_{0.799}(R''SiO_{3/2})_{0.10}$ with $R'$—$(CH_2)_{10}$—COOH and $R''$ a phenyl radical

| Counter-ion | Tensile strength, MPa | Strain at break, % |
|---|---|---|
| $Li^+$ | 1.65 | 48 |
| $Mg^{2+}$ | 25 | 12 |

Example 10

Blends of PDMS Ionomers with MQ Resins as Hot Melt Materials

PDMS-based ionomers can be mixed with trimethylated silica particles (in short MQ resins) to obtain miscible blends with modified rheological behavior. In particular, the addition of MQ resin raises the glass transition and lowers the rubbery plateau modulus. The difference with the procedure used in Example 9 is that the MQ/PDMS ionomer blends do not rely on branching or phenyl incorporation to attain higher matrix glass transitions. In contrast, the presence of nano-scale MQ particles alters the PDMS polymer dynamics. As an example, a 50% $Al^{3+}$ neutralized PDMS ionomer (based on $(Me_3SiO_{1/2})_{0.018}$ $(MeR'SiO_{2/2})_{0.032}(Me_2SiO_{2/2})_{0.95}$ with R'—$(CH_2)_{10}$—COOH see Example 4) was used as the host polymer, modified with different levels of MQ resin (DOW CORNING® 5-7104 INT). A 50% solids solution was made of the ionomer and MQ resin in toluene/methanol (99/1 wt/wt) as a solvent. After mixing overnight, thin films were cast and stripped of solvent at 150° C. for 1 h and 180° C. for 30 min. All blends were transparent solids at room temperature. This indicates that MQ is fully miscible with the 50% $Al^{3+}$ neutralized PDMS ionomer in the composition range tested. Results are shown in Table 8.

TABLE 8

Characteristics of 50% $Al^{3+}$ neutralized PDMS ionomers blended in different ratios with MQ resin

| ionomer/MQ (wt/wt) | Rubbery plateau modulus*, Pa | Flow temperature**, °C. | Glass transition***, °C. |
|---|---|---|---|
| 1/0 | 45,384 | 109 | −116 |
| 7/3 | 27,350 | 108 | −94 |
| 6/4 | 18,600 | 77 | −70 |
| 5/5 | n.a.**** | 78 | −63 |
| 4/6 | n.a.**** | 120 | n.a. |

*rubbery plateau modulus determined as G' at the minimum in tan δ (G"/G') in a tan δ vs. temperature oscillatory shear rheology experiment
**flow temperature, as determined from the temperature at which G' reaches 1 kPa upon heating
***glass transition as measured by oscillatory shear rheology as the maximum in tan δ vs. temperature
****the rheological profile doesn't exhibit a rubbery plateau modulus due to the proximity of the flow temperature to the glass transition The advantage of using MQ resin as opposed to branching and phenyl incorporation for a hot melt application would be that MQ/PDMS blends are already used in this application and a lot of the beneficial properties of MQ/PDMS blends would be retained with the added control introduced by the ionomeric aggregates regarding faster solidification upon cooling and control over melt flow temperature. Therefore, PDMS ionomer could extend the application window of hot melt materials.

Example 11

PDMS Ionomers for use in Gellants for Cosmetic Applications

The purpose of this evaluation was to use siloxane ionomers as transparent thickeners for cosmetic applications. An example would be a stick antiperspirant containing a large (75%) amount of carrier fluid. The 10 mol % $Li^+$ neutralized siloxane ionomer from example 4 was used. Before stripping the solvent after synthesis of the metal neutralized ionomer, a cosmetic carrier with high boiling point was added and the original solvent was removed by a solvent exchange procedure. Cyclosiloxanes were used as the carrier (DOW CORNING® 246 Fluid), for example, and a 1 hour stripping step at 100° C., 100 mmHg was sufficient to remove the original solvent (toluene) and retain the carrier. In this way, the 10 mol % $Li^+$ neutralized siloxane ionomer was swollen by the cyclosiloxanes to form a homogeneous, soft, clear gel.

Example 123

Synthesis of Polydimethylsiloxanes (PDMS) Bearing 4.3 mol % Pendant Carboxy Acid Functional Rradicals 209.8 g of a PDMS having pendant hydrogen groups (SiH functionality) amounting to 7.8 mol % SiH was loaded to a reaction vessel together with 209.8 g of toluene to make a 50% solids solution. A nitrogen blanket was applied, the mixture was heated to 110° C. and 36.79 g of trimethylsilylated undecylenic acid was added followed by the addition of 0.579 g of a 7876 ppm Pt in toluene solution (Pt#4), corresponding to 10 ppm of Pt based on the sum of SiH functional PDMS, toluene and trimethylsilylated undecylenic acid. The mixture was heated at 110° C. for 1 hour. 26.99 g of 1-octene was added. The mixture was heated at 110° C. for an additional hour. Carbon black (17.7 g) was added. The reaction mixture was heated at 80° C. overnight in order to remove color. The reaction mixture was filtered through a 5.0 m filter. A colorless, clear material was obtained. To deprotect the polymer and convert it to a carboxy acid functional polymer the following process was repeated 2×:23.00 g of methanol was added, refluxed for 1 hour and then volatiles were distilled off up to a pot temperature of 110° C. Product was stripped to dryness using a rotavapor at an oil bath temperature of 90° C. and reduced pressured (~1 mm Hg). Product was hazy and analysis by NMR showed some residual protected COOH groups. Diluted product with toluene and added 23.0 g of methanol. Heated at 60° C. for 3 hours. Product was stripped to dryness using a rotavapor at an oil bath temperature of 90° C. and reduced pressured (~1 mm Hg). Product was filtered through a 0.45 m filter. Product was a clear, colorless, viscous liquid at room temperature. The composition of the final material as confirmed by NMR:$(Me_3SiO)_{1/2})_{0.009}(MeR'SiO_{2/2})_{0.043}(MeR''SiO_{2/2})_{0.030}(Me_2SiO_{2/2})_{0.917}(MeHSiO_{2/2})_{0.001}$ with R'—$(CH_2)_{10}$—COOH and R"—$(CH_2)_7$—$CH_3$ Example 14

Synthesis of Polydimethylsiloxanes Bearing Pendant Carboxy Acid Functional Radicals, Neutralized with Aluminum Counter-Ions The carboxy acid functional PDMS, prepared in example A, was partially neutralized with aluminum counter-ions ($Al^{3+}$). A flask was loaded with 35.00 g of the carboxy acid functional PDMS and 40.83 g of toluene. A solution of 0.770 g of aluminum acetylacetonate in 11.67 g of methanol was then added with mixing. After mixing for 1 hour at reflux, some volatiles were removed to increase the solids content to about 65%. The remainder of the solvents were then removed to produce the thermoplastic elastomer.

Example 15

Analysis of Ionomer for PV Encapsulant

A sample of the Ionomer from Example 14 was tested for optical properties. To obtain optical properties, the material was first pressed in a hot press at 100 C for 5 minutes between Teflon sheets. This condition gave a nice optically clear film. The refractive index was measured on the Metricon prism coupler:

| Wavelength | RI |
|---|---|
| 632.8 nm | 1.4146 |
| 1321 nm | 1.4077 |
| 1554 nm | 1.4054 |

The film was then placed in the Cary 5000 Spectrophotometer and the % Transmission was measured versus wavelength. The data collected is compared to a typical polydimethylsiloxane gel sample. The Ionomer has less transparency in the lower wavelengths but has higher transparency than competitive EVA. The decrease in overall transmission of the Ionomer compared to polydimethylsiloxane between 400-1600 is because the Ionomer sample was slightly thicker.

Next the film was laminated into a solar cell configuration by placing the film on top of a piece of Solatex solar glass and placing it in vacuum chamber for 30 minutes. Then the film/glass was removed from the chamber and the cell was pressed into the soft film. Once the glass/cell sandwich was cooled the adhesion was qualitatively checked by trying to shear the cell off the glass, this could not be done. The cell broke prior to any shearing of the material.

That which is claimed is:

1. A method of encapsulating a photovoltaic device with a thermoplastic elastomer comprising:
    sandwiching at least one layer of a thermoplastic elastomer between a superstrate and a photovoltaic cell
wherein the thermoplastic elastomer comprises at least one silicone ionomer having an average Formula (1) $(X_vR_{3-v}SiO_{1/2})_a(X_wR_{2-w}SiO_{2/2})_b(X_yR_{1-y}SiO_{3/2})_c(SiO_{4/2})_d$ where each R is an independently selected monovalent alkyl group or aryl group, each X is independently selected from a monovalent alkyl group, aryl group and a carboxy functional group having a Formula (2) -G-COOZ, where G is a divalent spacer group having at least 2 spacing atoms, each Z is independently selected from hydrogen or a cation independently selected from alkali metal cations, alkali earth metal cations, transition metal cations, and metal cations, v is 0 to 3, w is 0 to 2, y is 0 to 1, $0 \le a \le 0.9$; $0 \le b \le 1$; $0 \le c \le 0.9$, $0 \le d \le 0.3$ and $a+b+c+d=1$, provided that on average there is at least 0.002 mole carboxy functional groups per silicon atom and at least 10 mole percent of the Z groups of the carboxy functional group are an independently selected cation.

2. The method of claim 1 wherein the process comprises
    disposing the thermoplastic elastomer on the superstrate;
    disposing the photovoltaic cell on the thermoplastic elastomer; and
    heating above the flow temperature of the thermoplastic elastomer.

3. The method of claim 1 wherein the process comprises
    disposing the thermoplastic elastomer on the superstrate;
    disposing the photovoltaic cell on the thermoplastic elastomer;
    disposing a second layer of a thermoplastic elastomer on the photovoltaic cell; and
    heating above the flow temperatures of the thermoplastic elastomers.

4. A photovoltaic device comprising:
    a superstrate;
    a thermoplastic elastomer disposed on a surface of the superstrate; and
    a photovoltaic cell disposed on the thermoplastic elastomer;
    wherein the thermoplastic elastomer comprises at least one silicone ionomer having an average Formula (1) $(X_vR_{3-v}SiO_{1/2})_a(X_wR_{2-w}SiO_{2/2})_b(X_yR_{1-y}SiO_{3/2})_c(SiO_{4/2})_d$ where each R is an independently selected monovalent alkyl group or aryl group, each X is independently selected from a monovalent alkyl group, aryl group and a carboxy functional group having a Formula (2) -G-COOZ, where G is a divalent spacer group having at least 2 spacing atoms, each Z is independently selected from hydrogen or a cation independently selected from alkali metal cations, alkali earth metal cations, transition metal cations, and metal cations, v is 0 to 3, w is 0 to 2, y is 0 to 1, $0 \le a \le 0.9$; $0 \le b \le 1$; $0 \le c \le 0.9$, $0 \le d \le 0.3$ and $a+b+c+d=1$, provided that on average there is at least 0.002 mole carboxy functional groups per silicon atom and at least 10 mole percent of the Z groups of the carboxy functional group are an independently selected cation.

5. The photovoltaic device of claim 4 further comprising a second layer of thermoplastic elastomer disposed on the surface of the photovoltaic cell.

6. The photovoltaic device of claim 5 further comprising a substrate disposed on the surface of the second layer of thermoplastic elastomer.

7. The photovoltaic device of claim 4 wherein at least 50 mole percent of the Z groups of the carboxy functional group are an independently selected cation.

8. The photovoltaic device of claim 4 wherein at least 75 mole percent of the Z groups of the carboxy functional group are an independently selected cation.

9. The photovoltaic device of claim 4 wherein at least 25 mole percent of the Z groups of the carboxy functional group are an independently selected cation.

10. The photovoltaic device of claim 4 where the cation is selected from Li, Na, K, Cs, Mg, Ca, Ba, Zn, Cu, Ni, Ga, Al, Mn, and Cr.

11. The photovoltaic device of claim 4 where the cation is selected from Li, Na, K, Zn, Ni, Al, Mn, Mg.

12. The photovoltaic device of any of claim 4 where on average there are at least 0.01 mole carboxy functional groups per silicon atom.

13. The photovoltaic device of claim 4 where on average there are from 0.002 to 0.5 mole carboxy functional groups per silicon atom.

14. The photovoltaic device of claim 4 wherein the thermoplastic elastomer comprises a blend of at least two silicone ionomers.

15. The photovoltaic device of claim 4 wherein the thermoplastic elastomer further comprises an MQ resin.

16. The photovoltaic device of claim 4 wherein the thermoplastic elastomer further comprising filler.

17. A method of dissipating heat comprising:
    i) interposing a composition comprising a silicone ionomer along a thermal path between a heat source and a heat spreader;
    wherein the silicone ionomer has an average Formula (1) $(X_vR_{3-v}SiO_{1/2})_a(X_wR_{2-w}SiO_{2/2})_b(X_yR_{1-y}SiO_{3/2})_c(SiO_{4/2})_d$ where each R is an independently selected monovalent alkyl group or aryl group, each X is independently selected from a monovalent alkyl group, aryl group and a carboxy functional group having a Formula (2)-G-COOZ, where G is a divalent spacer group having at least 2 spacing atoms, each Z is independently selected from hydrogen or a cation independently selected from alkali metal cations, alkali earth metal cations, transition metal cations, and metal cations, v is 0 to 3, w is 0 to 2, y is 0 to 1, $0 \le a \le 0.9$; $0 \le b \le 1$; $0 \le c \le 0.9$, $0 \le d \le 0.3$ and $a+b+c+d=1$, provided that on average there is at least 0.002 mole carboxy functional groups per silicon atom and at least 10 mole percent of the Z groups of the carboxy functional group are an independently selected cation.

18. The method of claim 17, wherein the composition comprising the silicone ionomer also comprises a thermally conductive filler.

19. The method of claim 17, wherein the heat source comprises an electronic device.

20. The method of claim 17, further comprising: ii) heating the composition to a temperature equal to or greater than softening temperature of the composition, and iii) applying pressure to the composition; and iv) cooling the composition to a temperature less than the phase change temperature.

* * * * *